United States Patent
Kim et al.

(10) Patent No.: US 10,381,066 B2
(45) Date of Patent: Aug. 13, 2019

(54) SEMICONDUCTOR MEMORY DEVICE WITH BURST MODE

(71) Applicant: SK hynix Inc., Icheon-si, Gyeonggi-do (KR)

(72) Inventors: Daesuk Kim, Icheon-si (KR); Jaeil Kim, Yongin-si (KR)

(73) Assignee: SK hynix Inc., Icheon-si, Gyeonggi-do (KR)

(*) Notice: Subject to any disclaimer, the term of this patent is extended or adjusted under 35 U.S.C. 154(b) by 0 days.

(21) Appl. No.: 15/706,975

(22) Filed: Sep. 18, 2017

(65) Prior Publication Data
US 2018/0151217 A1   May 31, 2018

(30) Foreign Application Priority Data
Nov. 30, 2016  (KR) .................. 10-2016-0162320

(51) Int. Cl.
| G11C 11/4093 | (2006.01) |
| G11C 7/22 | (2006.01) |
| G11C 7/10 | (2006.01) |
| G11C 11/4076 | (2006.01) |
| G11C 8/12 | (2006.01) |

(52) U.S. Cl.
CPC .......... *G11C 11/4093* (2013.01); *G11C 7/109* (2013.01); *G11C 7/1018* (2013.01); *G11C 7/1066* (2013.01); *G11C 7/22* (2013.01); *G11C 11/4076* (2013.01); *G11C 7/1012* (2013.01); *G11C 8/12* (2013.01)

(58) Field of Classification Search
CPC ... G11C 11/4093; G11C 11/4076; G11C 7/22; G11C 7/1066
See application file for complete search history.

(56) References Cited

U.S. PATENT DOCUMENTS

| 2007/0091715 A1* | 4/2007 | Hara | ................... G11C 7/1027 365/239 |
| 2012/0287729 A1 | 11/2012 | Hirobe | |
| 2017/0221534 A1* | 8/2017 | Sohn | ................... G11C 7/1009 |

FOREIGN PATENT DOCUMENTS

KR    1020130098681 A    9/2013

* cited by examiner

*Primary Examiner* — Ajay Ojha
(74) *Attorney, Agent, or Firm* — William Park & Associates Ltd.

(57) ABSTRACT

A semiconductor device may include a data input and output circuit (I/O) configured to selectively or simultaneously drive input and output lines according to a burst length and a location of a memory area selected by an address to allow the semiconductor device to receive or output data regardless of the burst length being changed.

24 Claims, 10 Drawing Sheets

SEMICONDUCTOR MEMORY DEVICE WITH BURST MODE

CROSS-REFERENCE TO RELATED APPLICATIONS

The present application claims priority under 35 U.S.C 119(a) to Korean Application No. 10-2016-0162320, filed on Nov. 30, 2016, which is incorporated herein by reference in its entirety.

BACKGROUND

1. Technical Field

Embodiments of the present disclosure may generally relate to a semiconductor device and, more particularly, to a semiconductor device configured for receiving and outputting data according to a burst length.

2. Related Art

Semiconductor devices have been continuously developed to operate at a high speed. As a result, the semiconductor devices have been designed to receive and output data in synchronization with an external clock signal. A burst operation corresponds to a typical operation for receiving and outputting the data in synchronization with the external clock signal. According to the burst operation, the semiconductor device may successively receive or output a plurality of data corresponding to a burst length in response to a single write command or a single read command if the burst length is set by a mode register set (MRS).

The burst length (BL), which is set for the burst operation, may have any one of various values such as four, eight, and sixteen. If, for example, the burst length (BL) is set to be eight (i.e., BL=8), "8"-bit data may be successively inputted to or outputted from the semiconductor device by a single write command or a single read command.

SUMMARY

According to an embodiment, a semiconductor device may be provided. The semiconductor device may include an input and output (input/output) (I/O) control circuit and a data I/O circuit. The I/O control circuit may be configured to generate first and second write control signals selectively enabled and first to fourth write selection signals selectively enabled, according to a burst length signal and a selection address signal. The data I/O circuit may be configured to transmit first transfer data loaded on a first I/O line to a first memory area and transmit second transfer data loaded on a second I/O line to a second memory area, based on the first to fourth write selection signals, if a burst length determined by the burst length signal is set as a first burst length. The data I/O circuit may be configured to transmit the first transfer data to the first memory area or transmit the second transfer data to the second memory area, based on the first to fourth write selection signals, if the burst length is set as a second burst length.

According to an embodiment, a semiconductor device may be provided. The semiconductor device may include an input/output (I/O) control circuit, a write path circuit, and a data I/O circuit. The I/O control circuit may be configured to generate first and second write control signals selectively enabled, first and second read control signals selectively enabled, first to fourth write selection signals selectively enabled, and first to fourth read selection signals selectively enabled, according to a burst length signal and a selection address signal during a write operation and a read operation. The write path circuit may latch data, align the latched data based on the burst length signal and the first and second write control signals, and may output the aligned data as first transfer data and second transfer data through a first I/O line and a second I/O line. The data I/O circuit may be configured to transmit the first transfer data loaded on the first I/O line to a first memory area and transmit the second transfer data loaded on the second I/O line to a second memory area, based on the first to fourth write selection signals, if a burst length determined by the burst length signal is set as a first burst length. The data I/O circuit may be configured to transmit the first transfer data to the first memory area or transmit the second transfer data to the second memory area, based on the first to fourth write selection signals, if the burst length is set as a second burst length.

According to an embodiment, a semiconductor device may be provided. The semiconductor device may include a data input and output circuit (I/O) configured to selectively or simultaneously drive input and output lines according to a burst length and a location of a memory area selected by an address to allow the semiconductor device to receive or output data regardless of the burst length being changed.

According to an embodiment, a semiconductor device may be provided. The semiconductor device may include an input and output (I/O) control circuit configured to generate first and second read control signals selectively enabled and first to fourth read selection signals selectively enabled, according to a burst length signal and a selection address signal. The semiconductor device may include a data I/O circuit configured to output first internal data outputted from a first memory area as first transfer data and output second internal data outputted from a second memory area as second transfer data if a burst length determined by the burst length signal is set as a first burst length, and configured to output the first internal data as the first transfer data or output second internal data outputted from a second memory area as second transfer data if a burst length is set as the second burst length, based on the first to fourth read selection signals.

DETAILED DESCRIPTION

Various embodiments of the present disclosure will be described hereinafter with reference to the accompanying drawings. However, the embodiments described herein are for illustrative purposes only and are not intended to limit the scope of the present disclosure.

Various embodiments may be directed to semiconductor devices configured for receiving and outputting data according to a burst length.

For reference, an embodiment including additional components may be provided. Furthermore, an logic high or logic low configuration indicating an active state of a signal or circuit may be changed depending on embodiments. Furthermore, the configuration of a logic gate or logic gates required for implementing the same function or operation may be modified. That is, the logic gate configuration of one type of operation and another logic gate configuration for the same type of operation may be replaced with each other, depending on a specific situation. If necessary, various logic gates may be applied to implement the configurations.

Figure 1:
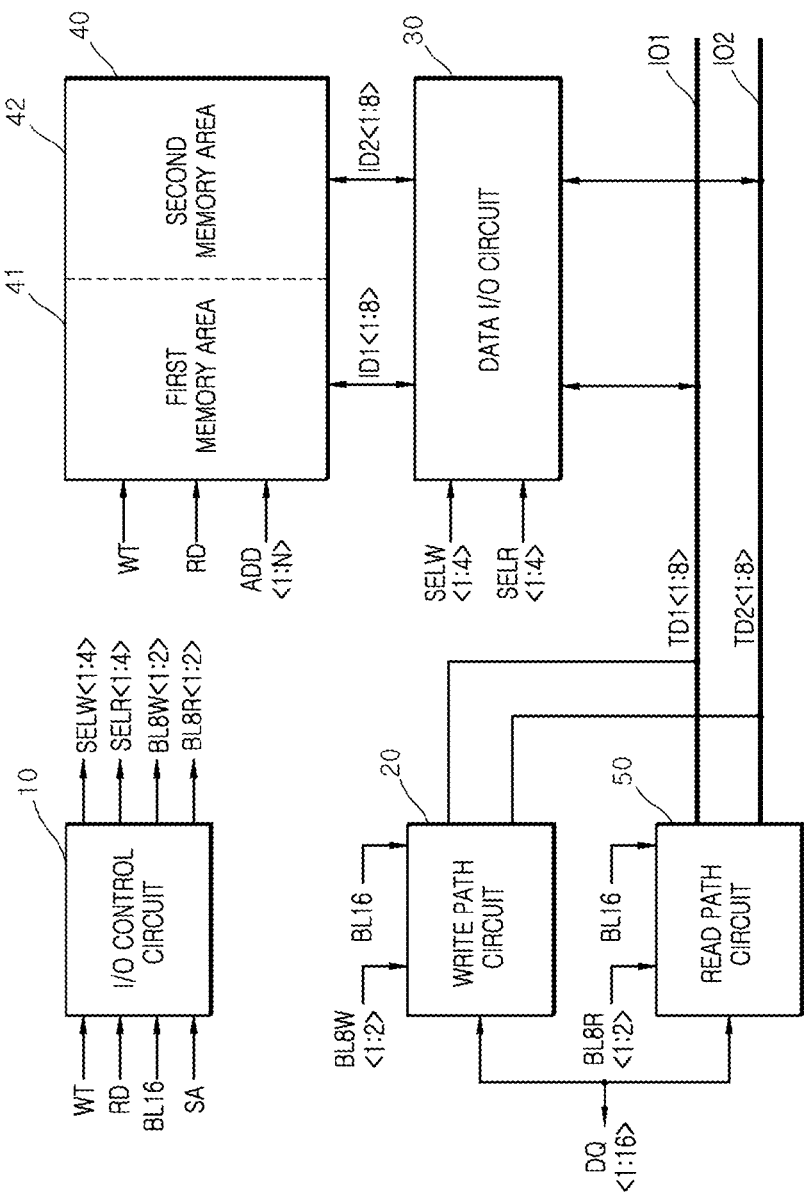
FIG. 1 is a block diagram illustrating a configuration of a semiconductor device according to an embodiment of the present disclosure.

Referring to FIG. 1, a semiconductor device according to various embodiments may be configured to include an input/output (I/O) control circuit 10, a write path circuit 20, a data I/O circuit 30, a bank 40 and a read path circuit 50.

The I/O control circuit 10 may generate first and second write control signals BL8W<1:2>, at least one of which is selectively enabled and first to fourth write selection signals SELW<1:4>, at least one of which is selectively enabled, in response to a write signal WT, a burst length signal BL16 and a selection address signal SA. The I/O control circuit 10 may generate the first and second write control signals BL8W<1:2>, at least one of which is selectively enabled and the first to fourth write selection signals SELW<1:4>, at least one of which is selectively enabled, in response to the burst length signal BL16 and the selection address signal SA during a write operation. The I/O control circuit 10 may generate first and second read control signals BL8R<1:2>, at least one of which is selectively enabled and first to fourth read selection signals SELR<1:4>, at least one of which is selectively enabled, in response to a read signal RD, the burst length signal BL16 and the selection address signal SA. The I/O control circuit 10 may generate the first and second read control signals BL8R<1:2>, at least one of which is selectively enabled and the first to fourth read selection signals SELR<1:4>, at least one of which is selectively enabled, in response to the burst length signal BL16 and the selection address signal SA during a read operation. The write signal WT may be enabled during the write operation. The write signal WT may correspond to a write command for executing the write operation. The read signal RD may be enabled during the read operation. The read signal RD may correspond to a read command for executing the read operation. The burst length signal BL16 may be a signal including information on a burst length. The burst length may be set as a first burst length if the burst length signal BL16 is enabled, and the burst length may be set as a second burst length if the burst length signal BL16 is disabled. The first burst length may be set to be, for example but not limited to, sixteen (i.e., BL=16). The burst length of sixteen means that "16"-bit data are successively inputted to or outputted from the semiconductor device during a single write operation (i.e., by a single write command) or a single read operation (i.e., by a single read command). The second burst length may be set to be, for example but not limited to, eight (i.e., BL=8). The burst length of eight means that "8"-bit data are successively inputted to or outputted from the semiconductor device during a single write operation (i.e., by a single write command) or a single read operation (i.e., by a single read command). The selection address signal SA may be set to include information for selecting any one of the first and second memory areas 41 and 42 constituting the bank 40 or for selecting both of the first and second memory areas 41 and 42.

The write path circuit 20 may latch data DQ<1:16> during the write operation and may align the latched data DQ<1:16> in response to the first and second write control signals BL8W <1:2>. The write path circuit 20 may output the aligned data DQ<1:16> as first transfer data TD1<1:8> and second transfer data TD2<1:8> through a first I/O line IO1 and a second I/O line IO2. The first transfer data TD1<1:8> may correspond to the data DQ<1:8> loaded on the first I/O line IO1 during the write operation. The second transfer data TD2<1:8> may correspond to the data DQ<1:8> or the data DQ<1:16> loaded on the second I/O line IO2 during the write operation.

The data I/O circuit 30 may output the first transfer data TD1<1:8> as first internal data ID1<1:8> to be stored into the first memory area 41 in response to the first to fourth write selection signals SELW<1:4> if the burst length is set as the first burst length. The data I/O circuit 30 may output the second transfer data TD2<1:8> as second internal data ID2<1:8> to be stored into the second memory area 42 in response to the first to fourth write selection signals SELW<1:4> if the burst length is set as the first burst length. The data I/O circuit 30 may store the first transfer data TD1<1:8> into the first memory area 41 or store the second transfer data TD2<1:8> into the second memory area 42 in response to the first to fourth write selection signals SELW<1:4> if the burst length is set as the second burst length. The data I/O circuit 30 may output the first internal data ID1<1:8> outputted from the first memory area 41 as the first transfer data TD1<1:8> in response to the first to fourth read selection signals SELR<1:4> if the burst length is set as the first burst length. The data I/O circuit 30 may output the second internal data ID2<1:8> outputted from the second memory area 42 as the second transfer data TD2<1:8> in response to the first to fourth read selection signals SELR<1:4> if the burst length is set as the first burst length. The data I/O circuit 30 may output the first internal data ID1<1:8> as the first transfer data TD1<1:8> or output the second internal data ID2<1:8> as the second transfer data TD2<1:8> in response to the first to fourth read selection signals SELR<1:4> if the burst length is set as the second burst length.

The bank 40 may include the first memory area 41 and the second memory area 42.

The first memory area 41 may store the first internal data ID1<1:8> into memory cells (not illustrated) of the first memory area 41 which are selected by the address ADD<1:N> during the write operation. The first memory area 41 may store the first internal data ID1<1:8> into memory cells (not illustrated) of the first memory area 41 which are selected by the address ADD<1:N> in response to the write signal WT. The first memory area 41 may output the first internal data ID1<1:8> stored in memory cells (not illustrated) of the first memory area 41 which are selected by the address ADD<1:N> during the read operation. The first memory area 41 may output the first internal data ID1<1:8> stored in memory cells (not illustrated) of the first memory area 41 which are selected by the address ADD<1:N> in response to the read signal RD.

The second memory area 42 may store the second internal data ID2<1:8> into memory cells (not illustrated) of the second memory area 42 which are selected by the address ADD<1:N> during the write operation. The second memory area 42 may store the second internal data ID2<1:8> into memory cells (not illustrated) of the second memory area 42 which are selected by the address ADD<1:N> in response to the write signal WT. The second memory area 42 may output the second internal data ID2<1:8> stored in memory cells (not illustrated) of the second memory area 42 which are selected by the address ADD<1:N> during the read operation. The second memory area 42 may output the second internal data ID2<1:8> stored in memory cells (not illustrated) of the second memory area 42 which are selected by the address ADD<1:N> in response to the read signal RD.

The read path circuit 50 may latch the first and second transfer data TD1<1:8> and TD2<1:8> during the read operation and may output the latched first and second transfer data TD1<1:8> and TD2<1:8> as the data DQ<1:16> in response to the burst length signal BL16 and the first and second read control signals BL8R<1:2>. The first transfer data TD1<1:8> may correspond to the first internal data ID1<1:8> or the second internal data ID2<1:8> loaded on the first I/O line IO1 during the read operation. The second transfer data TD2<1:8> may correspond to the first internal data ID1<1:8> or the second internal data ID2<1:8> loaded on the second I/O line IO2 during the read operation.

Although FIG. 1 illustrates an example in which the semiconductor device includes only the bank 40, the semiconductor device may be configured to include a plurality of banks sharing the first and second I/O lines IO1 and IO2 with each other according to the embodiments.

Figure 2:
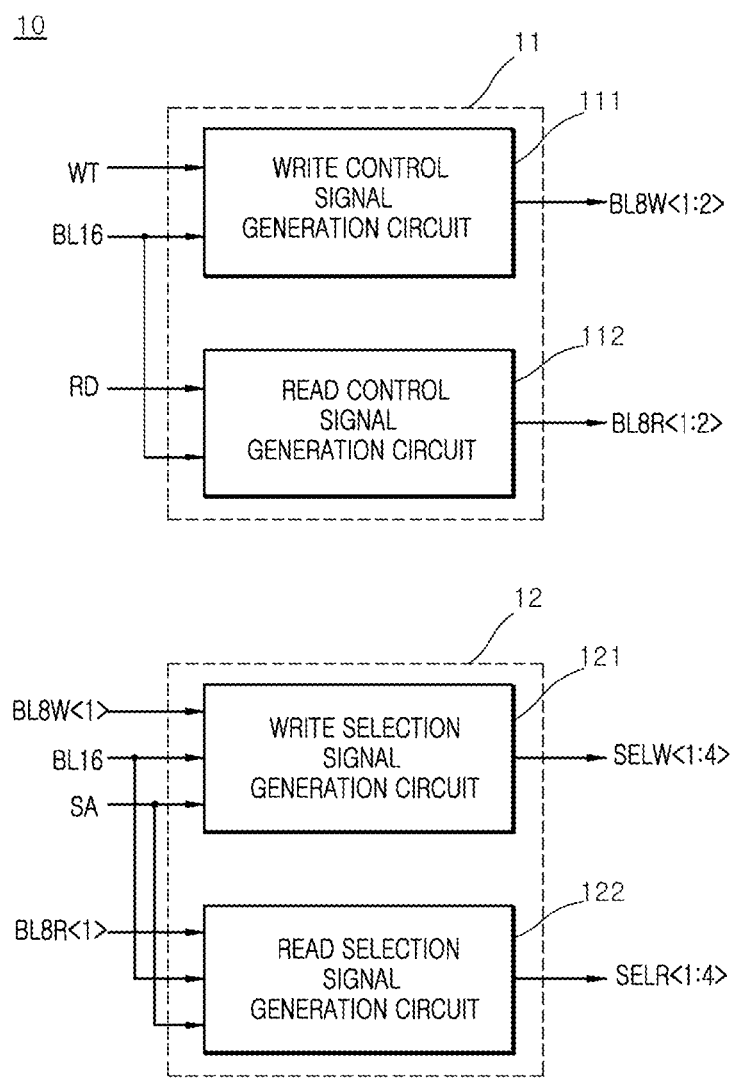
FIG. 2 is a block diagram illustrating an example of an input/output (I/O) control circuit included in the semiconductor device of FIG. 1.

Referring to FIG. 2, the I/O control circuit 10 may include a control signal generation circuit 11 and a selection signal generation circuit 12.

The control signal generation circuit 11 may include a write control signal generation circuit 111 and a read control signal generation circuit 112.

The write control signal generation circuit 111 may generate the first and second write control signals BL8W<1:2>, at least one of which is selectively enabled in response to the burst length signal BL16 during the write operation. The write control signal generation circuit 111 may generate the first and second write control signals BL8W<1:2>, at least one of which is selectively enabled in response to the write signal WT and the burst length signal BL16. The write control signal generation circuit 111 may generate the first and second write control signals BL8W<1:2> which are simultaneously enabled if the burst length signal BL16 is enabled during the write operation. The write control signal generation circuit 111 may generate the first and second write control signals BL8W<1:2>, at least one of which is selectively enabled if the burst length signal BL16 is disabled during the write operation.

The read control signal generation circuit 112 may generate the first and second read control signals BL8R<1:2>, at least one of which is selectively enabled in response to the burst length signal BL16 during the read operation. The read control signal generation circuit 112 may generate the first and second read control signals BL8R<1:2>, at least one of which is selectively enabled in response to the read signal RD and the burst length signal BL16. The read control signal generation circuit 112 may generate the first and second read control signals BL8R<1:2> which are simultaneously enabled if the burst length signal BL16 is enabled during the read operation. The read control signal generation circuit 112 may generate the first and second read control signals BL8R<1:2>, at least one of which is selectively enabled if the burst length signal BL16 is disabled during the read operation.

The selection signal generation circuit 12 may include a write selection signal generation circuit 121 and a read selection signal generation circuit 122.

The write selection signal generation circuit 121 may generate the first to fourth write selection signals SELW<1:4>, at least one of which is enabled according to logic levels of the burst length signal BL16 and the selection address signal SA in response to the first write control signal BL8W<1>.

The read selection signal generation circuit 122 may generate the first to fourth read selection signals SELR<1:4>, at least one of which is enabled according to logic levels of the burst length signal BL16 and the selection address signal SA in response to the first read control signal BL8R<1>.

Figure 3:
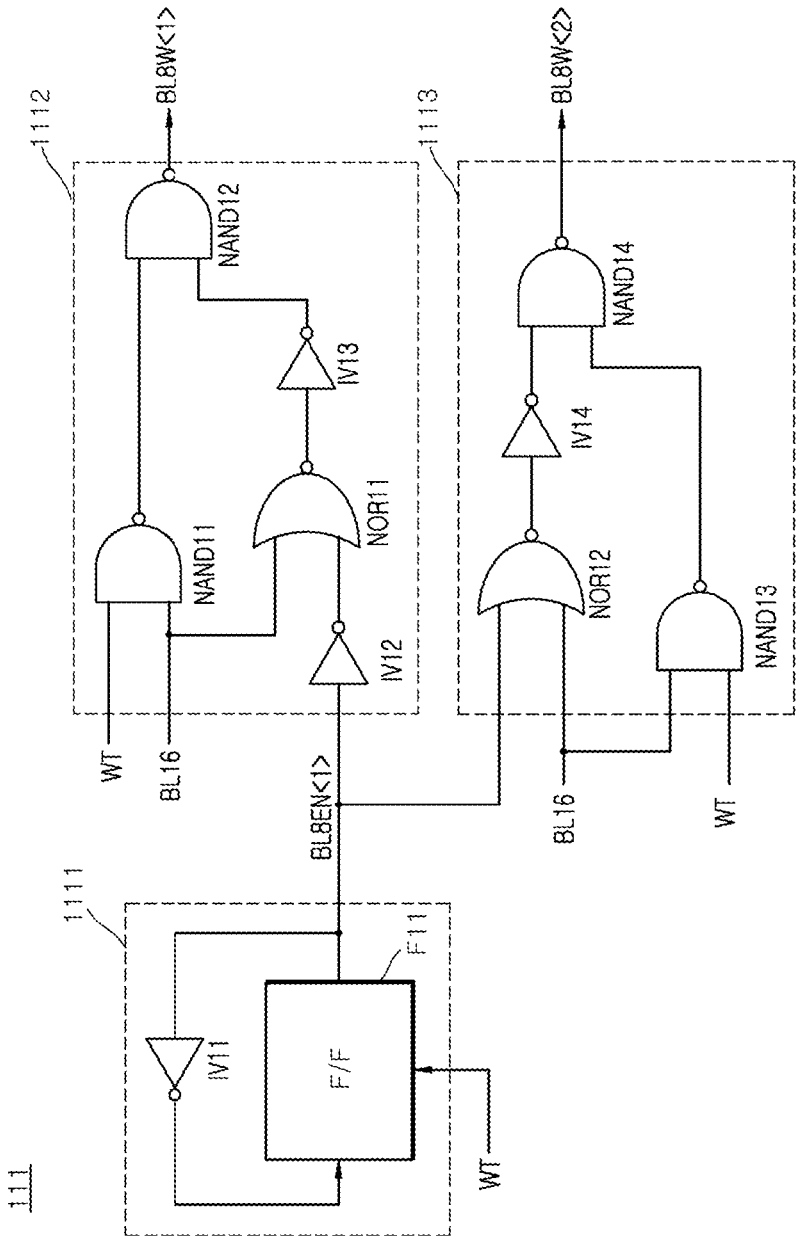
FIG. 3 is a circuit diagram illustrating an example of a write control signal generation circuit included in the I/O control circuit of FIG. 2.

Referring to FIG. 3, the write control signal generation circuit 111 may include a first enablement signal generation circuit 1111, a first logic circuit 1112 and a second logic circuit 1113.

The first enablement signal generation circuit 1111 may be configured to include a flip-flop F11 and an inverter IV11. The first enablement signal generation circuit 1111 may generate a first enablement signal BL8EN<1> of which its level changes in response to the write signal WT. The first enablement signal generation circuit 1111 may generate the first enablement signal BL8EN<1> in which its level changes if the write signal WT is inputted to the flip-flop F11.

The first logic circuit 1112 may be configured to include inversion operators, NOR operators, and NAND operators. In an embodiment, the first logic circuit 1112 may be configured to include, for example but not limited to, inverters IV12 and IV13, a NOR gate NOR11, and NAND gates NAND11 and NAND12. The first logic circuit 1112 may generate the first write control signal BL8W<1> which is enabled to have a logic "high" level if the burst length signal BL16 is enabled to have a logic "high" level during the write operation. The first logic circuit 1112 may generate the first write control signal BL8W<1> which is enabled according to a logic level of the first enablement signal BL8EN<1> if the burst length signal BL16 is disabled to have a logic "low" level. The first logic circuit 1112 may generate the first write control signal BL8W<1> which is enabled to have a logic "high" level if the burst length signal BL16 is disabled to have a logic "low" level and the first enablement signal BL8EN<1> has a logic "high" level. The first logic circuit 1112 may generate the first write control signal BL8W<1> which is disabled to have a logic "low" level if the burst length signal BL16 is disabled to have a logic "low" level and the first enablement signal BL8EN<1> has a logic "low" level.

The second logic circuit 1113 may be configured to include inversion operators, NOR operators, and NAND operators. In an embodiment, the second logic circuit 1113 may be configured to include, for example but not limited to, a NOR gate NOR12, an inverter IV14, and NAND gates NAND13 and NAND14. The second logic circuit 1113 may generate the second write control signal BL8W<2> which is enabled to have a logic "high" level if the burst length signal BL16 is enabled to have a logic "high" level during the write operation. The second logic circuit 1113 may generate the second write control signal BL8W<2> which is enabled according to a logic level of the first enablement signal BL8EN<1> if the burst length signal BL16 is disabled to have a logic "low" level. The second logic circuit 1113 may generate the second write control signal BL8W<2> which is disabled to have a logic "low" level if the burst length signal BL16 is disabled to have a logic "low" level and the first enablement signal BL8EN<1> has a logic "high" level. The second logic circuit 1113 may generate the second write control signal BL8W<2> which is enabled to have a logic "high" level if the burst length signal BL16 is disabled to have a logic "low" level and the first enablement signal BL8EN<1> has a logic "low" level.

Figure 4:
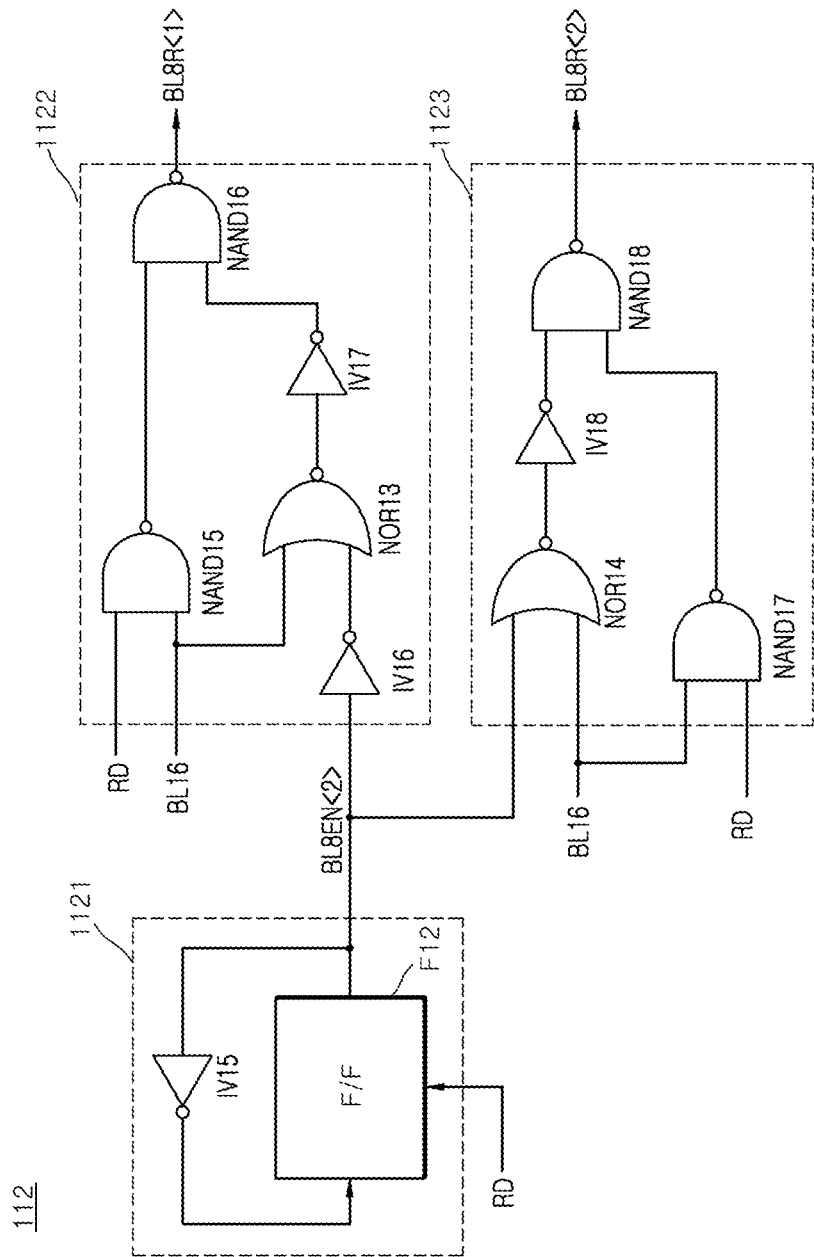
FIG. 4 is a circuit diagram illustrating an example of a read control signal generation circuit included in the I/O control circuit of FIG. 2.

Referring to FIG. 4, the read control signal generation circuit 112 may include a second enablement signal generation circuit 1121, a third logic circuit 1122 and a fourth logic circuit 1123.

The second enablement signal generation circuit 1121 may be configured to include a flip-flop F12 and an inverter IV15. The second enablement signal generation circuit 1121 may generate a second enablement signal BL8EN<2> of which its level changes in response to the read signal RD. The second enablement signal generation circuit 1121 may generate the second enablement signal BL8EN<2> of which its level changes if the read signal RD is inputted to the flip-flop F12.

The third logic circuit 1122 may be configured to include inversion operators, NOR operators, and NAND operators. In an embodiment, the third logic circuit 1122 may be configured to include, for example but not limited to, inverters IV16 and IV17, a NOR gate NOR13, and NAND gates NAND15 and NAND16. The third logic circuit 1122 may generate the first read control signal BL8R<1> which is enabled to have a logic "high" level if the burst length signal BL16 is enabled to have a logic "high" level during the read operation. The third logic circuit 1122 may generate the first read control signal BL8R<1> which is enabled according to a logic level of the second enablement signal BL8EN<2> if the burst length signal BL16 is disabled to have a logic "low" level. The third logic circuit 1122 may generate the first read control signal BL8R<1> which is enabled to have a logic "high" level if the burst length signal BL16 is disabled to have a logic "low" level and the second enablement signal BL8EN<2> has a logic "high" level. The third logic circuit 1122 may generate the first read control signal BL8R<1> which is disabled to have a logic "low" level if the burst length signal BL16 is disabled to have a logic "low" level and the second enablement signal BL8EN<2> has a logic "low" level.

The fourth logic circuit 1123 may be configured to include inversion operators, NOR operators, and NAND operators. In an embodiment, the fourth logic circuit 1123 may be configured to include, for example but not limited to, a NOR gate NOR14, an inverter IV18, and NAND gates NAND17 and NAND18. The fourth logic circuit 1123 may generate the second read control signal BL8R<2> which is enabled to have a logic "high" level if the burst length signal BL16 is enabled to have a logic "high" level during the read operation. The fourth logic circuit 1123 may generate the second read control signal BL8R<2> which is enabled according to a logic level of the second enablement signal BL8EN<2> if the burst length signal BL16 is disabled to have a logic "low" level. The fourth logic circuit 1123 may generate the second read control signal BL8R<2> which is disabled to have a logic "low" level if the burst length signal BL16 is disabled to have a logic "low" level and the second enablement signal BL8EN<2> has a logic "high" level. The fourth logic circuit 1123 may generate the second read control signal BL8R<2> which is enabled to have a logic "high" level if the burst length signal BL16 is disabled to have a logic "low" level and the second enablement signal BL8EN<2> has a logic "low" level.

Figure 5:
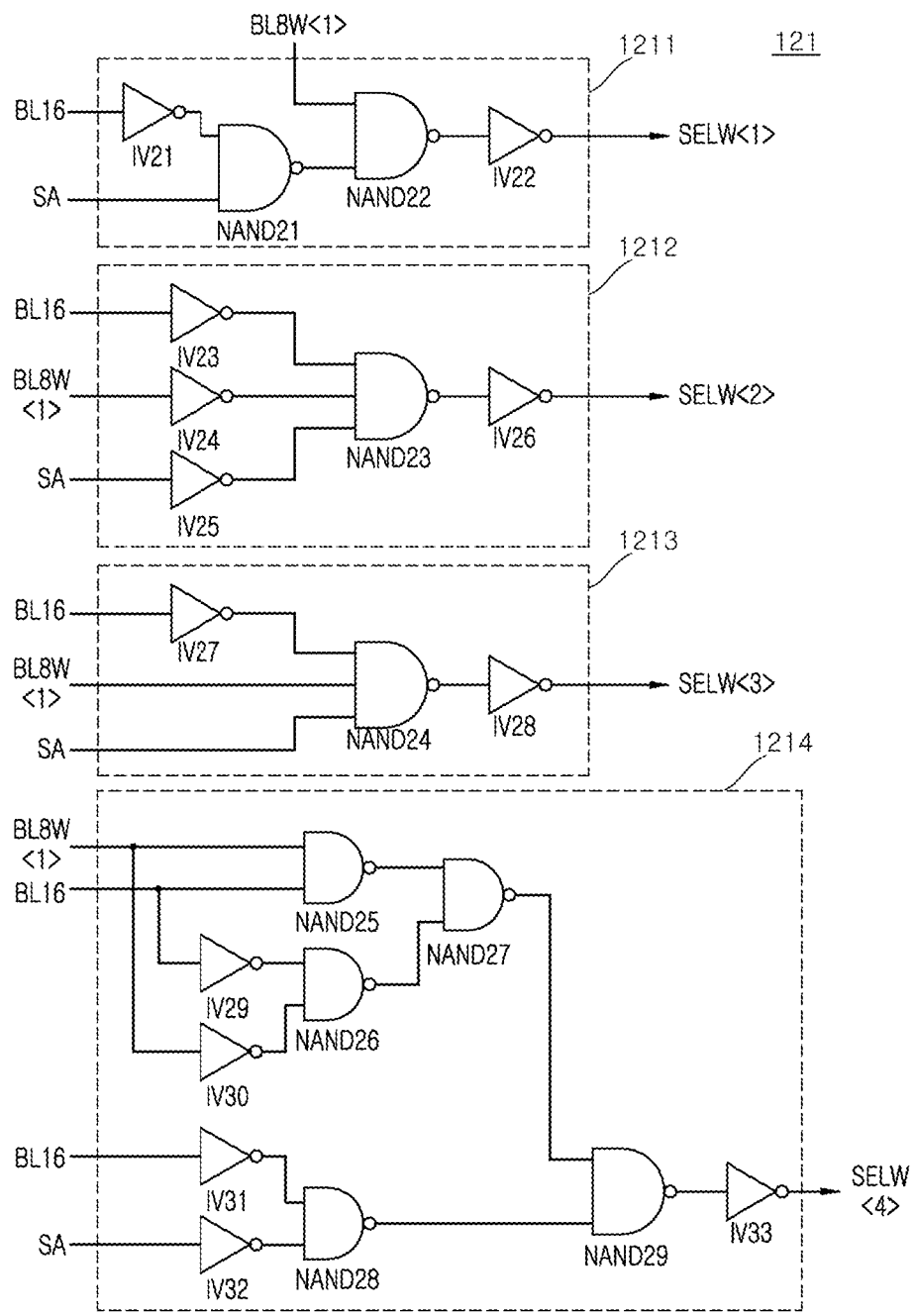
FIG. 5 is a circuit diagram illustrating an example of a write selection signal generation circuit included in the I/O control circuit of FIG. 2.

Referring to FIG. 5, the write selection signal generation circuit 121 may include a first write selection signal generation circuit 1211, a second write selection signal generation circuit 1212, a third write selection signal generation circuit 1213 and a fourth write selection signal generation circuit 1214.

The first write selection signal generation circuit 1211 may be configured to include inversion operators and NAND operators. In an embodiment, the first write selection signal generation circuit 1211 may be configured to include, for example but not limited to, inverters IV21 and IV22 and NAND gates NAND21 and NAND22. The first write selection signal generation circuit 1211 may generate the first write selection signal SELW<1> which is enabled in response to the burst length signal BL16 and the first write control signal BL8W<1>. The first write selection signal generation circuit 1211 may generate the first write selection signal SELW<1> which is enabled to have a logic "high" level if the first write control signal BL8W<1> is enabled to have a logic "high" level while the burst length signal BL16 is enabled to have a logic "high" level. The first write selection signal generation circuit 1211 may generate the first write selection signal SELW<1> which is disabled to have a logic "low" level if the first write control signal BL8W<1> is disabled to have a logic "low" level while the burst length signal BL16 is enabled to have a logic "high" level. The first write selection signal generation circuit 1211 may generate the first write selection signal SELW<1> which is enabled to have a logic "high" level if the first write control signal BL8W<1> is enabled to have a logic "high" level and the selection address signal SA has a logic "low" level while the burst length signal BL16 is disabled to have a logic "low" level.

The second write selection signal generation circuit 1212 may be configured to include inversion operators and NAND operators. In an embodiment, the second write selection signal generation circuit 1212 may be configured to include, for example but not limited to, inverters IV23, IV24, IV25 and IV26 and a NAND gate NAND23. The second write selection signal generation circuit 1212 may generate the second write selection signal SELW<2> which is disabled to have a logic "low" level if the burst length signal BL16 is enabled to have a logic "high" level. The second write selection signal generation circuit 1212 may generate the second write selection signal SELW<2> which is enabled to have a logic "high" level if the first write control signal BL8W<1> is disabled to have a logic "low" level and the selection address signal SA has a logic "low" level while the burst length signal BL16 is disabled to have a logic "low" level.

The third write selection signal generation circuit 1213 may be configured to include inversion operators and NAND operators. In an embodiment, the third write selection signal generation circuit 1213 may be configured to include, for example but not limited to, inverters IV27 and IV28 and a NAND gate NAND24. The third write selection signal generation circuit 1213 may generate the third write selection signal SELW<3> which is disabled to have a logic "low" level if the burst length signal BL16 is enabled to have a logic "high" level. The third write selection signal generation circuit 1213 may generate the third write selection signal SELW<3> which is enabled to have a logic "high"

level if the first write control signal BL8W<1> is enabled to have a logic "high" level and the selection address signal SA has a logic "high" level while the burst length signal BL16 is disabled to have a logic "low" level.

The fourth write selection signal generation circuit 1214 may be configured to include inversion operators and NAND operators. In an embodiment, the fourth write selection signal generation circuit 1214 may be configured to include, for example but not limited to, inverters IV29, IV30, IV31, IV32 and IV33 and NAND gates NAND25, NAND26, NAND27, NAND28 and NAND29. The fourth write selection signal generation circuit 1214 may generate the fourth write selection signal SELW<4> which is enabled in response to the burst length signal BL16 and the first write control signal BL8W<1>. The fourth write selection signal generation circuit 1214 may generate the fourth write selection signal SELW<4> which is enabled to have a logic "high" level if the first write control signal BL8W<1> is enabled to have a logic "high" level while the burst length signal BL16 is enabled to have a logic "high" level. The fourth write selection signal generation circuit 1214 may generate the fourth write selection signal SELW<4> which is disabled to have a logic "low" level if the first write control signal BL8W<1> is disabled to have a logic "low" level while the burst length signal BL16 is enabled to have a logic "high" level. The fourth write selection signal generation circuit 1214 may generate the fourth write selection signal SELW<4> which is enabled to have a logic "high" level if the first write control signal BL8W<1> is disabled to have a logic "low" level and the selection address signal SA has a logic "high" level while the burst length signal BL16 is disabled to have a logic "low" level.

Figure 6:
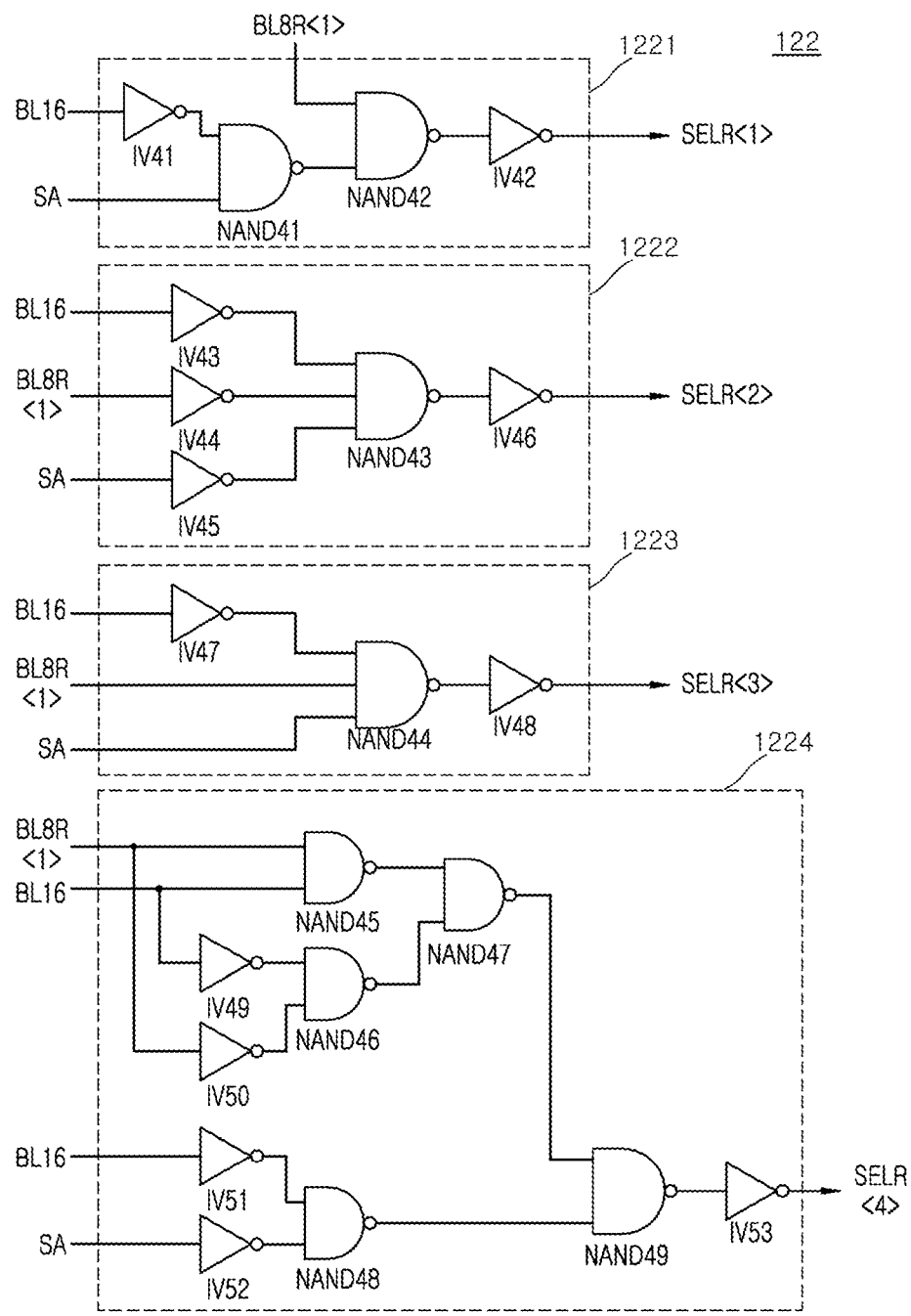
FIG. 6 is a circuit diagram illustrating an example of a read selection signal generation circuit included in the I/O control circuit of FIG. 2.

Referring to FIG. 6, the read selection signal generation circuit 122 may include a first read selection signal generation circuit 1221, a second read selection signal generation circuit 1222, a third read selection signal generation circuit 1223 and a fourth read selection signal generation circuit 1224.

The first read selection signal generation circuit 1221 may be configured to include inversion operators and NAND operators. In an embodiment, the first read selection signal generation circuit 1221 may be configured to include, for example but not limited to, inverters IV41 and IV42 and NAND gates NAND41 and NAND42. The first read selection signal generation circuit 1221 may generate the first read selection signal SELR<1> which is enabled in response to the burst length signal BL16 and the first read control signal BL8R<1>. The first read selection signal generation circuit 1221 may generate the first read selection signal SELR<1> which is enabled to have a logic "high" level if the first read control signal BL8R<1> is enabled to have a logic "high" level while the burst length signal BL16 is enabled to have a logic "high" level. The first read selection signal generation circuit 1221 may generate the first read selection signal SELR<1> which is disabled to have a logic "low" level if the first read control signal BL8R<1> is disabled to have a logic "low" level while the burst length signal BL16 is enabled to have a logic "high" level. The first read selection signal generation circuit 1221 may generate the first read selection signal SELR<1> which is enabled to have a logic "high" level if the first read control signal BL8R<1> is enabled to have a logic "high" level and the selection address signal SA has a logic "low" level while the burst length signal BL16 is disabled to have a logic "low" level.

The second read selection signal generation circuit 1222 may be configured to include inversion operators and NAND operators. In an embodiment, the second read selection signal generation circuit 1222 may be configured to include, for example but not limited to, inverters IV43, IV44, IV45 and IV46 and a NAND gate NAND43. The second read selection signal generation circuit 1222 may generate the second read selection signal SELR<2> which is disabled to have a logic "low" level if the burst length signal BL16 is enabled to have a logic "high" level. The second read selection signal generation circuit 1222 may generate the second read selection signal SELR<2> which is enabled to have a logic "high" level if the first read control signal BL8R<1> is disabled to have a logic "low" level and the selection address signal SA has a logic "low" level while the burst length signal BL16 is disabled to have a logic "low" level.

The third read selection signal generation circuit 1223 may be configured to include inversion operators and NAND operators. In an embodiment, the third read selection signal generation circuit 1223 may be configured to include, for example but not limited to, inverters IV47 and IV48 and a NAND gate NAND44. The third read selection signal generation circuit 1223 may generate the third read selection signal SELR<3> which is disabled to have a logic "low" level if the burst length signal BL16 is enabled to have a logic "high" level. The third read selection signal generation circuit 1223 may generate the third read selection signal SELR<3> which is enabled to have a logic "high" level if the first read control signal BL8R<1> is enabled to have a logic "high" level and the selection address signal SA has a logic "high" level while the burst length signal BL16 is disabled to have a logic "low" level.

The fourth read selection signal generation circuit 1224 may be configured to include inversion operators and NAND operators. In an embodiment, the fourth read selection signal generation circuit 1224 may be configured to include, for example but not limited to, inverters IV49, IV50, IV51, IV52 and IV53 and NAND gates NAND45, NAND46, NAND47, NAND48 and NAND49. The fourth read selection signal generation circuit 1224 may generate the fourth read selection signal SELR<4> which is enabled in response to the burst length signal BL16 and the first read control signal BL8R<1>. The fourth read selection signal generation circuit 1224 may generate the fourth read selection signal SELR<4> which is enabled to have a logic "high" level if the first read control signal BL8R<1> is enabled to have a logic "high" level while the burst length signal BL16 is enabled to have a logic "high" level. The fourth read selection signal generation circuit 1224 may generate the fourth read selection signal SELR<4> which is disabled to have a logic "low" level if the first read control signal BL8R<1> is disabled to have a logic "low" level while the burst length signal BL16 is enabled to have a logic "high" level. The fourth read selection signal generation circuit 1224 may generate the fourth read selection signal SELR<4> which is enabled to have a logic "high" level if the first read control signal BL8R<1> is disabled to have a logic "low" level and the selection address signal SA has a logic "high" level while the burst length signal BL16 is disabled to have a logic "low" level.

Figure 7:
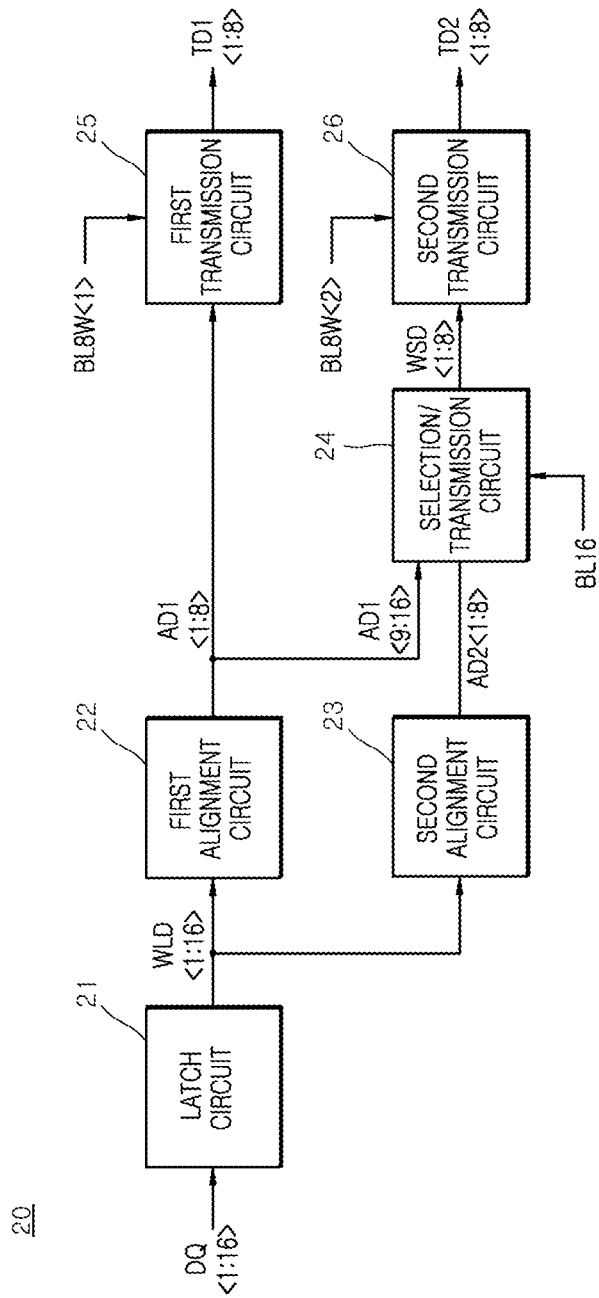
FIG. 7 is a block diagram illustrating an example of a write path circuit included in the semiconductor device of FIG. 1.

Referring to FIG. 7, the write path circuit 20 may include a latch circuit 21, a first alignment circuit 22, a second alignment circuit 23, a selection and transmission (selection/transmission) circuit 24, a first transmission circuit 25 and a second transmission circuit 26.

The latch circuit 21 may include a plurality of buffers to buffer the data DQ<1:16> provided by, for example but not limited to, an external device during the write operation. The latch circuit 21 may latch the buffered data DQ<1:16> and may output the latched data DQ<1:16> as write latch data WLD<1:16>. The data DQ<1:16> may be "16"-bit data which are successively inputted to the latch circuit 21 if the burst length is set as the first burst length. The data DQ<1:16> may be "8"-bit data which are successively inputted to the latch circuit 21 if the burst length is set as the second burst length.

The first alignment circuit 22 may align the write latch data WLD<1:16> with each other to generate first aligned data AD1<1:16>. The first aligned data AD1<1:8> among the first aligned data AD1<1:16> may be generated by aligning the write latch data WLD<1:8> with each other. The first aligned data AD1<9:16> among the first aligned data AD1<1:16> may be generated by aligning the write latch data WLD<9:16> with each other.

The second alignment circuit 23 may align the write latch data WLD<1:8> among the write latch data WLD<1:16> to generate second aligned data AD2<1:8>.

The selection/transmission circuit 24 may output the first aligned data AD1<9:16> or the second aligned data AD2<1:8> as write selection data WSD<1:8> in response to the burst length signal BL16. The selection/transmission circuit 24 may output the first aligned data AD1<9:16> as the write selection data WSD<1:8> if the burst length signal BL16 is enabled to have a logic "high" level. The selection/transmission circuit 24 may output the second aligned data AD2<1:8> as the write selection data WSD<1:8> if the burst length signal BL16 is disabled to have a logic "low" level.

The first transmission circuit 25 may output the first aligned data AD1<1:8> as the first transfer data TD1<1:8> in response to the first write control signal BL8W<1>. The first transmission circuit 25 may output the first aligned data AD1<1:8> as the first transfer data TD1<1:8> if the first write control signal BL8W<1> is enabled to have a logic "high" level.

The second transmission circuit 26 may output the write selection data WSD<1:8> as the second transfer data TD2<1:8> in response to the second write control signal BL8W<2>. The second transmission circuit 26 may output the write selection data WSD<1:8> as the second transfer data TD2<1:8> if the second write control signal BL8W<2> is enabled to have a logic "high" level.

Figure 8:
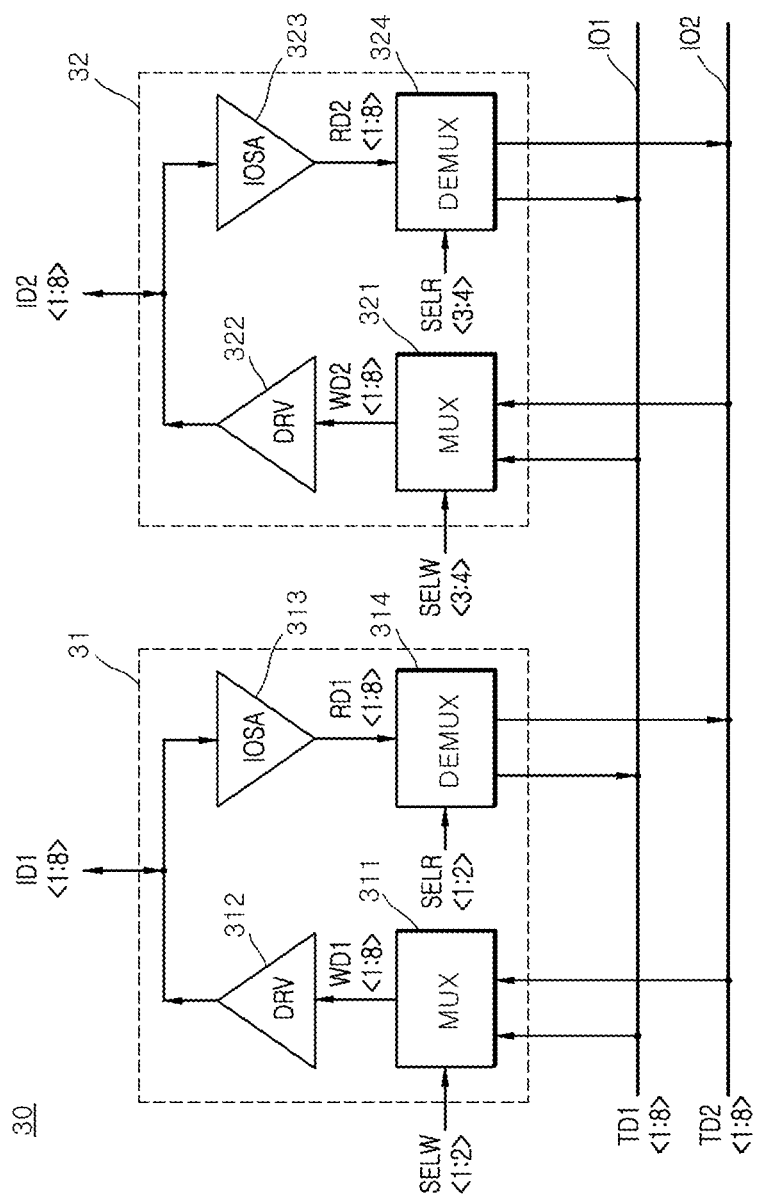
FIG. 8 is a block diagram illustrating an example of a data I/O circuit included in the semiconductor device of FIG. 1.

Referring to FIG. 8, the data I/O circuit 30 may include a first data I/O circuit 31 and a second data I/O circuit 32.

The first data I/O circuit 31 may include a first multiplexer 311, a first driver 312, a first sense amplifier 313 and a first demultiplexer 314.

The first multiplexer 311 may output the first transfer data TD1<1:8> or the second transfer data TD2<1:8> as first write data WD1<1:8> in response to the first and second write selection signals SELW<1:2>. The first multiplexer 311 may output the first transfer data TD1<1:8> as the first write data WD1<1:8> if the first write selection signals SELW<1> is enabled. The first multiplexer 311 may output the second transfer data TD2<1:8> as the first write data WD1<1:8> if the second write selection signals SELW<2> is enabled. The first transfer data TD1<1:8> may correspond to the data DQ<1:8> loaded on the first I/O line IO1 during the write operation. The second transfer data TD2<1:8> may correspond to the data DQ<1:16> loaded on the second I/O line IO2 during the write operation.

The first driver 312 may output the first write data WD1<1:8> as the first internal data ID1<1:8> during the write operation. The first driver 312 may drive the first internal data ID1<1:8> in response to the first write data WD1<1:8> during the write operation.

The first sense amplifier 313 may output the first internal data ID1<1:8> as first read data RD1<1:8> during the read operation. The first sense amplifier 313 may drive the first read data RD1<1:8> in response to the first internal data ID1<1:8> during the read operation.

The first demultiplexer 314 may output the first read data RD1<1:8> as the first transfer data TD1<1:8> or the second transfer data TD2<1:8> in response to the first and second read selection signals SELR<1:2>. The first demultiplexer 314 may output the first read data RD1<1:8> as the first transfer data TD1<1:8> if the first read selection signal SELR<1> is enabled. The first demultiplexer 314 may output the first read data RD1<1:8> as the second transfer data TD2<1:8> if the second read selection signal SELR<2> is enabled. The first transfer data TD1<1:8> may correspond to the first read data RD1<1:8> which are outputted to the first I/O line IO1 during the read operation. The second transfer data TD2<1:8> may correspond to the first read data RD1<1:8> which are outputted to the second I/O line IO2 during the read operation.

As described above, the first data I/O circuit 31 may output the first transfer data TD1<1:8> or the second transfer data TD2<1:8> as the first internal data ID1<1:8> in response to the first and second write selection signals SELW<1:2>. The first internal data ID1<1:8> outputted from the first data I/O circuit 31 may be stored into the first memory area 41. The first data I/O circuit 31 may output the first internal data ID1<1:8> as the first transfer data TD1<1:8> or the second transfer data TD2<1:8> in response to the first and second read selection signals SELR<1:2>.

The second data I/O circuit 32 may include a second multiplexer 321, a second driver 322, a second sense amplifier 323 and a second demultiplexer 324.

The second multiplexer 321 may output the first transfer data TD1<1:8> or the second transfer data TD2<1:8> as second write data WD2<1:8> in response to the third and fourth write selection signals SELW<3:4>. The second multiplexer 321 may output the first transfer data TD1<1:8> as the second write data WD2<1:8> if the third write selection signals SELW<3> is enabled. The second multiplexer 321 may output the second transfer data TD2<1:8> as the second write data WD2<1:8> if the fourth write selection signals SELW<4> is enabled. The first transfer data TD1<1:8> may correspond to the data DQ<1:8> loaded on the first I/O line IO1 during the write operation. The second transfer data TD2<1:8> may correspond to the data DQ<1:16> loaded on the second I/O line IO2 during the write operation.

The second driver 322 may output the second write data WD2<1:8> as the second internal data ID2<1:8> during the write operation. The second driver 322 may drive the second internal data ID2<1:8> in response to the second write data WD2<1:8> during the write operation.

The second sense amplifier 323 may output the second internal data ID2<1:8> as second read data RD2<1:8> during the read operation. The second sense amplifier 323 may drive the second read data RD2<1:8> in response to the second internal data ID2<1:8> during the read operation.

The second demultiplexer 324 may output the second read data RD2<1:8> as the first transfer data TD1<1:8> or the second transfer data TD2<1:8> in response to the third and fourth read selection signals SELR<3:4>. The second demultiplexer 324 may output the second read data RD2<1:8> as the first transfer data TD1<1:8> if the third read selection signal SELR<3> is enabled. The second demultiplexer 324 may output the second read data RD2<1:8> as the second transfer data TD2<1:8> if the fourth read selection signal SELR<4> is enabled. The first transfer data TD1<1:8> may correspond to the second read data RD2<1:8> which are outputted to the first I/O line IO1 during the read operation. The second transfer data TD2<1:8> may correspond to the second read data RD2<1:8> which are outputted to the second I/O line IO2 during the read operation.

As described above, the second data I/O circuit 32 may output the first transfer data TD1<1:8> or the second transfer data TD2<1:8> as the second internal data ID2<1:8> in response to the third and fourth write selection signals SELW<3:4>. The second internal data ID2<1:8> outputted from the second data I/O circuit 32 may be stored into the second memory area 42. The second data I/O circuit 32 may output the second internal data ID2<1:8> as the first transfer data TD1<1:8> or the second transfer data TD2<1:8> in response to the third and fourth read selection signals SELR<3:4>.

Figure 9:
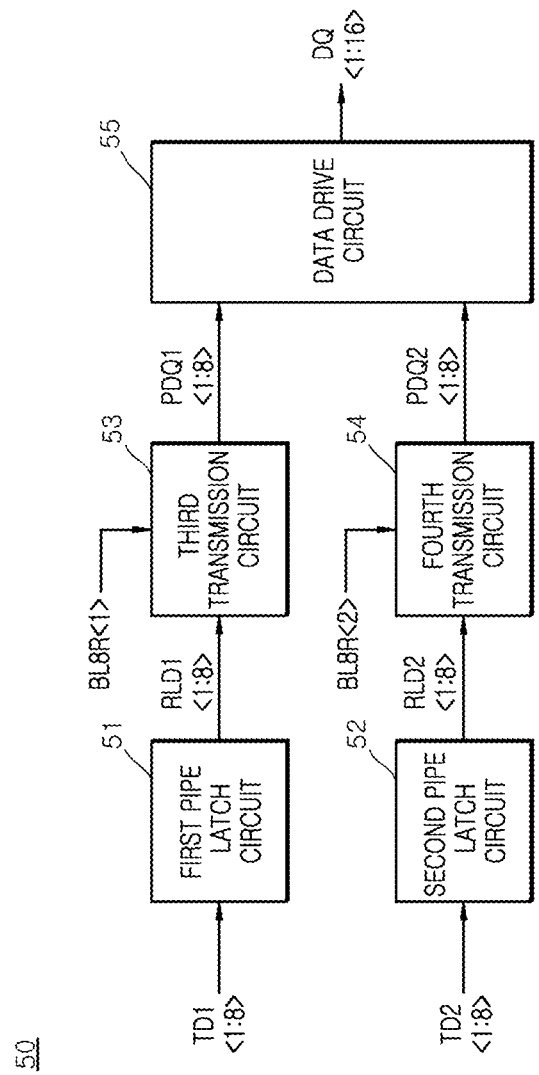
FIG. 9 is a block diagram illustrating an example of a read path circuit included in the semiconductor device of FIG. 1.

Referring to FIG. 9, the read path circuit 50 may include a first pipe latch circuit 51, a second pipe latch circuit 52, a third transmission circuit 53, a fourth transmission circuit 54 and a data drive circuit 55.

The first pipe latch circuit 51 may latch the first transfer data TD1<1:8> to generate first read latch data RLD1<1:8>. The first pipe latch circuit 51 may latch the first transfer data TD1<1:8> to output the latched first transfer data TD1<1:8> as the first read latch data RLD1<1:8> during the read operation. The first pipe latch circuit 51 may be realized using a general pipe latch circuit including a plurality of latches.

The second pipe latch circuit 52 may latch the second transfer data TD2<1:8> to generate second read latch data RLD2<1:8>. The second pipe latch circuit 52 may latch the second transfer data TD2<1:8> to output the latched second transfer data TD2<1:8> as the second read latch data RLD2<1:8> during the read operation. The second pipe latch circuit 52 may be realized using a general pipe latch circuit including a plurality of latches.

The third transmission circuit 53 may output the first read latch data RLD1<1:8> as first pre-data PDQ1<1:8> in response to the first read control signal BL8R<1>. The third transmission circuit 53 may output the first read latch data RLD1<1:8> as the first pre-data PDQ1<1:8> if the first read control signal BL8R<1> is enabled to have a logic "high" level.

The fourth transmission circuit 54 may output the second read latch data RLD2<1:8> as second pre-data PDQ2<1:8> in response to the second read control signal BL8R<2>. The fourth transmission circuit 54 may output the second read latch data RLD2<1:8> as the second pre-data PDQ2<1:8> if the second read control signal BL8R<2> is enabled to have a logic "high" level.

The data drive circuit 55 may drive the data DQ<1:16> in response to the first pre-data PDQ1<1:8> and the second pre-data PDQ2<1:8>. The data drive circuit 55 may drive the data DQ<1:8> in response to the first pre-data PDQ1<1:8>. The data drive circuit 55 may drive the data DQ<9:16> in response to the second pre-data PDQ2<1:8>. The data DQ<1:16> may be transmitted from the semiconductor device to, for example but not limited to, an external device.

The write operation of the semiconductor device having an aforementioned configuration will be described hereinafter in conjunction with one case that the burst length is set as the first burst length and another case that the burst length is set as the second burst length. In the event that the burst length is set as the second burst length, the write operation may be performed twice.

First, in the event that the burst length is set as the first burst length, the write operation of a semiconductor device will be described hereinafter.

The write control signal generation circuit 111 of the I/O control circuit 10 may generate the first and second write control signals BL8W<1:2> which are enabled to have a logic "high" level in response to the write signal WT having a logic "high" level and the burst length signal BL16 having a logic "high" level.

The write selection signal generation circuit 121 may generate the first write selection signal SELW<1> and the fourth write selection signal SELW<4> which are enabled to have a logic "high" level in response to the first write control signal BL8W<1> having a logic "high" level and the burst length signal BL16 having a logic "high" level.

The latch circuit 21 of the write path circuit 20 may latch the data DQ<1:16> to output the latched data DQ<1:16> as the write latch data WLD<1:16>. The data DQ<1:16> may be "16"-bit data which are successively inputted to the latch circuit 21.

The first alignment circuit 22 may align the write latch data WLD<1:16> to generate the first aligned data AD1<1:16>. The first aligned data AD1<1:8> among the first aligned data AD1<1:16> may be generated by aligning the write latch data WLD<1:8>. The first aligned data AD1<9:16> among the first aligned data AD1<1:16> may be generated by aligning the write latch data WLD<9:16>.

The second alignment circuit 23 may align the write latch data WLD<1:8> among the write latch data WLD<1:16> to generate the second aligned data AD2<1:8>.

The selection/transmission circuit 24 may output the first aligned data AD1<9:16> as the write selection data WSD<1:8> in response to the burst length signal BL16 having a logic "high" level.

The first transmission circuit 25 may output the first aligned data AD1<1:8> as the first transfer data TD1<1:8> in response to the first write control signal BL8W<1> having a logic "high" level. The first transfer data TD1<1:8> may be outputted through the first I/O line IO1.

The second transmission circuit 26 may output the write selection data WSD<1:8> as the second transfer data TD2<1:8> in response to the second write control signal BL8W<2> having a logic "high" level. The second transfer data TD2<1:8> may be outputted through the second I/O line IO2.

The first data I/O circuit 31 may output the first transfer data TD1<1:8> loaded on the first I/O line IO1 as the first internal data ID1<1:8> in response to the first write selection signal SELW<1> having a logic "high" level.

The second data I/O circuit 32 may output the second transfer data TD2<1:8> loaded on the second I/O line IO2 as the second internal data ID2<1:8> in response to the fourth write selection signal SELW<4> having a logic "high" level.

The first memory area 41 may store the first internal data ID1<1:8> into memory cells (not illustrated) selected by the address ADD<1:N> in response to the write signal WT.

The second memory area 42 may store the second internal data ID2<1:8> into memory cells (not illustrated) selected by the address ADD<1:N> in response to the write signal WT.

Next, an example in which the write operation of a semiconductor device is performed twice with the second burst length will be described hereinafter. In such a case, the selection address signal SA may select the first memory area 41 during the first write operation, and the selection address signal SA may select the second memory area 42 during the second write operation.

The write control signal generation circuit 111 of the I/O control circuit 10 may generate the first write control signal BL8W<1> having a logic "high" level and the second write control signal BL8W<2> having a logic "low" level, in response to the first write signal WT having a logic "high" level and the burst length signal BL16 having a logic "low" level.

The write selection signal generation circuit 121 may generate the first write selection signal SELW<1> having a logic "high" level in response to the first write control signal BL8W<1> having a logic "high" level and the burst length signal BL16 having a logic "low" level.

The latch circuit 21 of the write path circuit 20 may latch the data DQ<1:8> to output the latched data DQ<1:8> as the write latch data WLD<1:8>. The data DQ<1:8> may be "8"-bit data which are successively inputted to the latch circuit 21.

The first alignment circuit 22 may align the write latch data WLD<1:8> to generate the first aligned data AD1<1:8>.

The second alignment circuit 23 may align the write latch data WLD<1:8> to generate the second aligned data AD2<1:8>.

The selection/transmission circuit 24 may output the second aligned data AD2<1:8> as the write selection data WSD<1:8> in response to the burst length signal BL16 having a logic "low" level.

The first transmission circuit 25 may output the first aligned data AD1<1:8> as the first transfer data TD1<1:8> in response to the first write control signal BL8W<1> having a logic "high" level. The first transfer data TD1<1:8> may be outputted through the first I/O line IO1.

The second transmission circuit 26 may not output the write selection data WSD<1:8> as the second transfer data TD2<1:8> in response to the second write control signal BL8W<2> having a logic "low" level.

The first data I/O circuit 31 may output the first transfer data TD1<1:8> loaded on the first I/O line IO1 as the first internal data ID1<1:8> in response to the first write selection signal SELW<1> having a logic "high" level.

The second data I/O circuit 32 may not generate the second internal data ID2<1:8>.

The first memory area 41 may store the first internal data ID1<1:8> into memory cells (not illustrated) selected by the address ADD<1:N> in response to the first write signal WT.

The write control signal generation circuit 111 of the I/O control circuit 10 may generate the first write control signal BL8W<1> having a logic "low" level and the second write control signal BL8W<2> having a logic "high" level, in response to the second write signal WT having a logic "high" level and the burst length signal BL16 having a logic "low" level.

The write selection signal generation circuit 121 may generate the fourth write selection signal SELW<4> having a logic "high" level in response to the first write control signal BL8W<1> having a logic "low" level, the burst length signal BL16 having a logic "low" level, and the selection address signal SA having a logic "high" level.

The latch circuit 21 of the write path circuit 20 may latch the data DQ<1:8> to output the latched data DQ<1:8> as the write latch data WLD<1:8>. The data DQ<1:8> may be "8"-bit data which are successively inputted to the latch circuit 21.

The first alignment circuit 22 may align the write latch data WLD<1:8> to generate the first aligned data AD1<1:8>.

The second alignment circuit 23 may align the write latch data WLD<1:8> to generate the second aligned data AD2<1:8>.

The selection/transmission circuit 24 may output the second aligned data AD2<1:8> as the write selection data WSD<1:8> in response to the burst length signal BL16 having a logic "low" level.

The first transmission circuit 25 may not output the first aligned data AD1<1:8> as the first transfer data TD1<1:8> in response to the first write control signal BL8W<1> having a logic "low" level.

The second transmission circuit 26 may output the write selection data WSD<1:8> as the second transfer data TD2<1:8> in response to the second write control signal BL8W<2> having a logic "high" level. The second transfer data TD2<1:8> may be outputted through the second I/O line IO2.

The first data I/O circuit 31 may not generate the first internal data ID1<1:8>.

The second data I/O circuit 32 may output the second transfer data TD2<1:8> loaded on the second I/O line IO2 as the second internal data ID2<1:8> in response to the fourth write selection signal SELW<4> having a logic "high" level.

The second memory area 42 may store the second internal data ID2<1:8> into memory cells (not illustrated) selected by the address ADD<1:N> in response to the second write signal WT.

As described above, a semiconductor device according to an embodiment may selectively or simultaneously drive the I/O lines according to a burst length and a location of a memory area selected by an address. Accordingly, the semiconductor device may stably receive or output the data even though the burst length changes.

Figure 10:
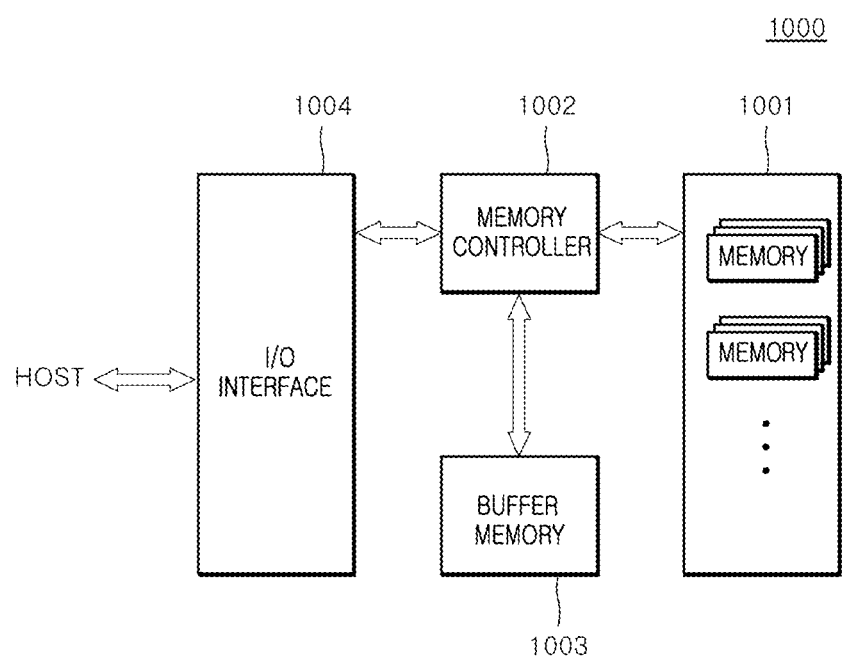
FIG. 10 is a block diagram illustrating a configuration of an electronic system employing the semiconductor device described with reference to FIGS. 1 to 9.

The semiconductor devices described with reference to FIGS. 1 to 9 may be applied to an electronic system that includes a memory system, a graphic system, a computing system, a mobile system, or the like. For example, as illustrated in FIG. 10, an electronic system 1000 according an embodiment may include a data storage circuit 1001, a memory controller 1002, a buffer memory 1003, and an input/output (I/O) interface 1004.

The data storage circuit 1001 may store data which are outputted from the memory controller 1002 or may read and output the stored data to the memory controller 1002, according to a control signal generated from the memory controller 1002. The data storage circuit 1001 may include the semiconductor devices illustrated in FIG. 1. The data storage circuit 1001 may include a nonvolatile memory that can retain its stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001 or the buffer memory 1003 or for outputting the data stored in the data storage circuit 1001 or the buffer memory 1003. Although FIG. 10 illustrates the memory controller 1002 with a single block, the memory controller 1002 may include one controller for controlling the data storage circuit 1001 comprised of a nonvolatile memory and another controller for controlling the buffer memory 1003 comprised of a volatile memory.

The buffer memory 1003 may temporarily store the data to be processed by the memory controller 1002. That is, the buffer memory 1003 may temporarily store the data which are outputted from or to be inputted to the data storage circuit 1001. The buffer memory 1003 may store the data, which are outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data generated from the memory controller 1002 to the external device (i.e., the host) through the I/O interface 1004. That is, the electronic system 1000 may communicate with the host through the I/O interface 1004. The I/O interface 1004 may include any one of various interface protocols such as, but not limited to, a universal serial bus (USB) drive, a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB drive, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

What is claimed is:

1. A semiconductor device comprising:
   an input and output (I/O) control circuit configured to generate first and second write control signals selectively enabled and first to fourth write selection signals selectively enabled, according to a burst length signal and a selection address signal; and
   a data I/O circuit configured to transmit first transfer data loaded on a first I/O line to a first memory area and transmit second transfer data loaded on a second I/O line to a second memory area if a burst length determined by the burst length signal is set as a first burst length and configured to transmit the first transfer data to the first memory area or transmit the second transfer data to the second memory area if the burst length is set as a second burst length, based on the first to fourth write selection signals.

2. The semiconductor device of claim 1, wherein the first burst length is set to be twice the second burst length.

3. The semiconductor device of claim 1, wherein the first and second write control signals and the first and fourth write selection signals are enabled if the burst length is set as the first burst length.

4. The semiconductor device of claim 1,
   wherein the first and second write control signals are selectively enabled if the burst length is set as the second burst length; and
   wherein the first and fourth write selection signals are selectively enabled according to the selection address signal if the burst length is set as the second burst length.

5. The semiconductor device of claim 1, wherein the selection address signal is a signal including information for selecting any one or both of the first memory area and the second memory area.

6. The semiconductor device of claim 1, wherein the I/O control circuit includes:
   a write control signal generation circuit configured to generate the first and second write control signals which are selectively enabled based on the burst length signal and a write signal; and
   a write selection signal generation circuit configured to generate the first to fourth write selection signals which are selectively enabled according to logic levels of the burst length signal and the selection address signal based on the first write control signal.

7. The semiconductor device of claim 6, wherein the write control signal generation circuit includes:
   an enablement signal generation circuit configured to generate an enablement signal having a level that changes based on the write signal;
   a first logic circuit configured to generate the first write control signal which is enabled based on the write signal if the burst length signal is enabled and which is enabled according to a logic level of the enablement signal if the burst length signal is disabled; and
   a second logic circuit configured to generate the second write control signal which is enabled based on the write signal if the burst length signal is enabled and which is enabled according to a logic level of the enablement signal if the burst length signal is disabled.

8. The semiconductor device of claim 6, wherein the write selection signal generation circuit includes:
   a first write selection signal generation circuit configured to generate the first write selection signal which is enabled based on the first write control signal if the burst length signal is enabled and which is enabled based on the selection address signal the first write control signal if the burst length signal is disabled;
   a second write selection signal generation circuit configured to generate the second write selection signal which is disabled if the burst length signal is enabled and which is enabled according to a logic level of the first write control signal based on the selection address signal if the burst length signal is disabled;
   a third write selection signal generation circuit configured to generate the third write selection signal which is disabled if the burst length signal is enabled and which is enabled according to a logic level of the first write control signal based on the selection address signal if the burst length signal is disabled; and
   a fourth write selection signal generation circuit configured to generate the fourth write selection signal which is enabled based on the first write control signal if the burst length signal is enabled and which is enabled based on the selection address signal and the first write control signal if the burst length signal is disabled.

9. The semiconductor device of claim 1, wherein the data I/O circuit includes:
   a first data I/O circuit configured to output the first transfer data or the second transfer data as first internal data based on the first and second write selection signals, wherein the first internal data are stored into the first memory area; and a second data I/O circuit configured to output the first transfer data or the second transfer data as second internal data based on the third and fourth write selection signals, wherein the second internal data are stored into the second memory area.

10. A semiconductor device comprising:
an input and output (I/O) control circuit configured to generate first and second write control signals selectively enabled, first and second read control signals selectively enabled, first to fourth write selection signals selectively enabled, and first to fourth read selection signals selectively enabled, according to a burst length signal and a selection address signal during a write operation and a read operation;
a write path circuit configured to latch data, configured to align the latched data based on the burst length signal and the first and second write control signals, and configured to output the aligned data as first transfer data and second transfer data through a first I/O line and a second I/O line; and
a data I/O circuit configured to transmit the first transfer data loaded on the first I/O line to a first memory area and transmit the second transfer data loaded on the second I/O line to a second memory area if a burst length determined by the burst length signal is set as a first burst length and configured to transmit the first transfer data to the first memory area or transmit the second transfer data to the second memory area if the burst length is set as a second burst length, based on the first to fourth write selection signals.

11. The semiconductor device of claim 10, wherein the first burst length is set to be twice the second burst length.

12. The semiconductor device of claim 10, wherein the I/O control circuit includes:
a control signal generation circuit configured to generate the first and second write control signals selectively enabled and the first and second read control signals selectively enabled, based on a write signal, a read signal, and the burst length signal; and
a selection signal generation circuit configured to generate the first to fourth write selection signals which are selectively enabled according to logic levels of the burst length signal and the selection address signal based on the first write control signal and configured to generate the first to fourth read selection signals which are selectively enabled according to logic levels of the burst length signal and the selection address signal based on the first read control signal.

13. The semiconductor device of claim 12, wherein the control signal generation circuit includes:
a write control signal generation circuit configured to generate the first and second write control signals which are selectively enabled based on the burst length signal and the write signal; and
a read control signal generation circuit configured to generate the first and second read control signals which are selectively enabled based on the burst length signal and the read signal.

14. The semiconductor device of claim 13, wherein the write control signal generation circuit includes:
a first enablement signal generation circuit configured to generate a first enablement signal having a level that changes based on the write signal;
a first logic circuit configured to generate the first write control signal which is enabled based on the write signal if the burst length signal is enabled and which is enabled according to a logic level of the first enablement signal if the burst length signal is disabled; and
a second logic circuit configured to generate the second write control signal which is enabled based on the write signal if the burst length signal is enabled and which is enabled according to a logic level of the first enablement signal if the burst length signal is disabled.

15. The semiconductor device of claim 13, wherein the read control signal generation circuit includes:
a second enablement signal generation circuit configured to generate a second enablement signal having a level that changes based on the read signal;
a third logic circuit configured to generate the first read control signal which is enabled based on the read signal if the burst length signal is enabled and which is enabled according to a logic level of the second enablement signal if the burst length signal is disabled; and
a fourth logic circuit configured to generate the second read control signal which is enabled based on the read signal if the burst length signal is enabled and which is enabled according to a logic level of the second enablement signal if the burst length signal is disabled.

16. The semiconductor device of claim 12, wherein the selection signal generation circuit includes:
a write selection signal generation circuit configured to generate the first to fourth write selection signals which are selectively enabled according to logic levels of the burst length signal and the selection address signal based on the first write control signal; and
a read selection signal generation circuit configured to generate the first to fourth read selection signals which are selectively enabled according to logic levels of the burst length signal and the selection address signal based on the first read control signal.

17. The semiconductor device of claim 16, wherein the write selection signal generation circuit includes:
a first write selection signal generation circuit configured to generate the first write selection signal which is enabled based on the first write control signal if the burst length signal is enabled and which is enabled based on the selection address signal the first write control signal if the burst length signal is disabled;
a second write selection signal generation circuit configured to generate the second write selection signal which is disabled if the burst length signal is enabled and which is enabled according to a logic level of the first write control signal based on the selection address signal if the burst length signal is disabled;
a third write selection signal generation circuit configured to generate the third write selection signal which is disabled if the burst length signal is enabled and which is enabled according to a logic level of the first write control signal based on the selection address signal if the burst length signal is disabled; and
a fourth write selection signal generation circuit configured to generate the fourth write selection signal which is enabled based on the first write control signal if the burst length signal is enabled and which is enabled based on the selection address signal and the first write control signal if the burst length signal is disabled.

18. The semiconductor device of claim 16, wherein the read selection signal generation circuit includes:
a first read selection signal generation circuit configured to generate the first read selection signal which is enabled based on the first read control signal if the burst length signal is enabled and which is enabled based on the first read control signal and the selection address signal if the burst length signal is disabled;

a second read selection signal generation circuit configured to generate the second read selection signal which is disabled if the burst length signal is enabled and which is enabled according to a logic level of the first read control signal based on the selection address signal if the burst length signal is disabled;

a third read selection signal generation circuit configured to generate the third read selection signal which is disabled if the burst length signal is enabled and which is enabled according to a logic level of the first read control signal based on the selection address signal if the burst length signal is disabled; and a fourth read selection signal generation circuit configured to generate the fourth read selection signal which is enabled based on the first read control signal if the burst length signal is enabled and which is enabled based on the selection address signal and the first read control signal if the burst length signal is disabled.

19. The semiconductor device of claim 10, further comprising a read path circuit configured to latch the first and second transfer data and configured to output the latched first and second transfer data as the data based on the burst length signal and the first and second read control signals.

20. The semiconductor device of claim 19, wherein the read path circuit comprises:

a first pipe latch circuit configured to latch the first transfer data to output the latched first transfer data as the first read latch data during the read operation;

a second pipe latch circuit configured to latch the second transfer data to output the latched second transfer data as the second read latch data during the read operation;

a first transmission circuit configured to output the first read latch data as first pre-data based on the first read control signal;

a second transmission circuit configured to output the second read latch data as second pre-data based on the second read control signal; and a data drive circuit configured to drive the data based on the first pre-data and the second pre-data.

21. The semiconductor device of claim 19, wherein the data I/O circuit is configured to output first internal data stored in the first memory area as the first transfer data and configured to output second internal data stored in the second memory area as the second transfer data, if the burst length is set as the first burst length; and wherein the data I/O circuit is configured to output the first internal data as the first transfer data or to output the second internal data as the second transfer data, if the burst length is set as the second burst length.

22. The semiconductor device of claim 21, wherein the data I/O circuit includes:

a first data I/O circuit configured to output the first transfer data or the second transfer data as the first internal data based on the first and second write selection signals and configured to output the first internal data as the first transfer data or the second transfer data based on the first and second read selection signals; and a second data I/O circuit configured to output the first transfer data or the second transfer data as the second internal data based on the third and fourth write selection signals and configured to output the second internal data as the first transfer data or the second transfer data based on the third and fourth read selection signals.

23. A semiconductor device comprising:

a write path circuit configured to latch data, configured to align the latched data based on a burst length signal and first and second write control signals, and configured to output the aligned data as first transfer data and second transfer data through a first I/O line and a second I/O line; and a data input and output circuit (I/O) configured to selectively or simultaneously drive the first I/O line and the second I/O line according to a burst length and a location of a memory area selected by an address to allow the semiconductor device to receive or output data regardless of the burst length being changed.

24. The semiconductor device of claim 23, further comprising:

an input and output (I/O) control circuit configured to generate the first and second write control signals selectively enabled and first to fourth write selection signals selectively enabled, according to the burst length signal and a selection address signal, wherein the data I/O circuit is configured to transmit first transfer data loaded on the first I/O line to a first memory area and transmit second transfer data loaded on the second I/O line to a second memory area if a burst length determined by the burst length signal is set as a first burst length and configured to transmit the first transfer data to the first memory area or transmit the second transfer data to the second memory area if the burst length is set as a second burst length, based on the first to fourth write selection signals.

* * * * *